(12) United States Patent
Flagello et al.

(10) Patent No.: US 7,113,259 B2
(45) Date of Patent: Sep. 26, 2006

(54) LITHOGRAPHIC APPARATUS AND DEVICE MANUFACTURING METHOD

(75) Inventors: Donis Flagello, Scottsdale, AZ (US);
John Doering, Tempe, AZ (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 11/218,574

(22) Filed: Sep. 6, 2005

(65) Prior Publication Data

US 2006/0007421 A1 Jan. 12, 2006

Related U.S. Application Data

(63) Continuation of application No. 10/698,012, filed on Oct. 31, 2003, now Pat. No. 6,954,256.

(51) Int. Cl.
*G03B 27/32* (2006.01)
*G03B 27/42* (2006.01)
*G03B 27/52* (2006.01)

(52) U.S. Cl. ............................ 355/53; 355/55; 355/63; 355/77

(58) Field of Classification Search ................. 355/30, 355/53, 55, 63, 77; 359/649, 656
See application file for complete search history.

(56) References Cited

U.S. PATENT DOCUMENTS

| | | | |
|---|---|---|---|
| 3,573,975 A | 4/1971 | Dhaka et al. ................ 117/212 |
| 3,648,587 A | 3/1972 | Stevens ....................... 95/44 R |
| 4,346,164 A | 8/1982 | Tabarelli et al. ............. 430/311 |
| 4,396,705 A | 8/1983 | Akeyama et al. ........... 430/326 |
| 4,480,910 A | 11/1984 | Takanashi et al. ............ 355/30 |
| 4,509,852 A | 4/1985 | Tabarelli et al. .............. 355/30 |
| 5,040,020 A | 8/1991 | Rauschenbach et al. ...... 355/53 |
| 5,121,256 A | 6/1992 | Corle et al. .................. 359/664 |
| 5,610,683 A | 3/1997 | Takahashi ..................... 355/53 |
| 5,715,039 A | 2/1998 | Fukuda et al. ................ 355/53 |
| 5,825,043 A | 10/1998 | Suwa .......................... 250/548 |
| 5,900,354 A | 5/1999 | Batchelder .................. 430/395 |
| 6,191,429 B1 | 2/2001 | Suwa .......................... 250/548 |
| 6,560,032 B1 | 5/2003 | Hatano ....................... 359/656 |
| 6,600,547 B1 | 7/2003 | Watson et al. ................ 355/30 |
| 6,603,130 B1 | 8/2003 | Bisschops et al. ........ 250/492.1 |
| 6,633,365 B1 | 10/2003 | Suenaga ....................... 355/53 |

(Continued)

FOREIGN PATENT DOCUMENTS

DE 224448 A1 7/1985

(Continued)

OTHER PUBLICATIONS

S. Owa et al., "Potential performance and feasibility of immersion lithography," NGL Workshop 2003, Jul. 10, 2003.

(Continued)

*Primary Examiner*—Rodney Fuller
(74) *Attorney, Agent, or Firm*—Pillsbury Winthrop Shaw Pittman, LLP (57) ABSTRACT

In a lithographic projection apparatus, a space between an optical element is filled with a first fluid and a second fluid separated by a transparent plate. The first and second fluids have different first and second indices of refraction, respectively. The first fluid is provided between a substrate and the transparent plate and has an index of refraction similar to the index of refraction of the substrate. The second fluid is provided between the transparent plate and the optical element and has an index of refraction similar to the index of refraction of the optical element. The transparent plate has a third index of refraction between the first and second indices of refraction and may be equal to the first index of refraction or the second index of refraction.

17 Claims, 5 Drawing Sheets

U.S. PATENT DOCUMENTS

| | | | |
|---|---|---|---|
| 6,809,794 | B1 | 10/2004 | Sewell |
| 2002/0163629 | A1 | 11/2002 | Switkes et al. ............... 355/53 |
| 2003/0123040 | A1 | 7/2003 | Almogy ...................... 355/69 |
| 2003/0174408 | A1 | 9/2003 | Rostalski et al. ........... 359/642 |
| 2004/0000627 | A1 | 1/2004 | Schuster ................. 250/201.2 |
| 2004/0021844 | A1 | 2/2004 | Suenaga ...................... 355/67 |

FOREIGN PATENT DOCUMENTS

| | | |
|---|---|---|
| DE | 242880 A1 | 2/1987 |
| EP | 0023231 B1 | 2/1981 |
| EP | 0418427 A2 | 3/1991 |
| EP | 1039511 A1 | 9/2000 |
| FR | 2 474 708 | 7/1981 |
| JP | 58-202448 | 11/1983 |
| JP | 62-65326 | 3/1987 |
| JP | 62-121417 | 6/1987 |
| JP | 63-157419 | 6/1988 |
| JP | 4-305915 | 10/1992 |
| JP | 4-305917 | 10/1992 |
| JP | 6-124873 | 5/1994 |
| JP | 7-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 2001-91849 | 4/2001 |
| WO | WO99/49504 | 9/1999 |
| WO | WO 2004/019128 A2 | 3/2004 |

OTHER PUBLICATIONS

H. Hogan, "New Semiconductor Lithography Makes a Splash," Photonics TechnologyWord, Oct. 2003, pp. 1-3.

M. Switkes et al., "Immerson Lithography at 157 nm," MIT Lincoln Lab, Orlando 2001-1, Dec. 17, 2001.

M. Switkes et al., "Immerson Lithography at 157 nm," J. Vac. Sci. Technol. B., vol. 19, No. 6, Nov./Dec. 2001, pp. 2353-2356.

M. Switkes et al., "Immersion Lithography: Optics for the 50 nm Node," 157 Anvers-1, Sep. 4, 2002.

B. J. Lin, "Drivers, Prospects, and Challenges for Immersion Lithography," tsmc, Inc., Sep. 2002.

B.J. Lin, "Proximity Prnting Through Liquid," IBM Technical Disclosure Bulletin, vol. 20, No. 11B, Apr. 1978, p. 4997.

B.J. Lin, "The Paths To Subhalf-Micrometer Optical Lithography," SPIE vol. 922, Optical/Laser Microlithography (1988), pp. 256-269.

G.W.W. Stevens, "Reduction of Waste Resulting from Mask Defects," Solid State Technilogy, Aug. 1978, vol. 21 008, pp. 68-72.

T. Matsuyama et al., "Nikon Projection Lens Update," Nikon Corporation, (date unknown).

S. Owa et al., "Immersion lithography; its potential performance and issues," SPIE Microlithography, 5040-186, Feb. 27, 2003.

Nikon Precision Europe GmbH, "Investor Relations—Nikon's Real Solutions", May 15, 2003.

H. Kawata et al., "Optical Projection Lithography using Lenses with Numerical Apertures Greater then Unity," Microelectronic Engineering 9 (1989), pp. 31-36.

J.A. Hoffnagle et al., "Liquid Immersion Deep-Ultraviolet Interferometric Lithography," J. Vac. Sci. Technol. B., vol. 17(6), Nov./Dec. 1999.

B.W. Smith et al., Immersion Optical Lithography at 193nm, Future Fab International, Issue 15, Jul. 11, 2003.

H. Kawata et al., "Fabrication of 0.2μm Fine Patterns Using Optical Projection Lithography with an Oil Immersion Lens," Jpn. J. Appl. Phys. vol. 31 (1992), pp. 4174-4177.

G. Owen et al., 1/8μm Optical Lithography, J. Vac. Sci. Technol. B., vol. 10, No. 6, Nov./Dec. 1992, pp. 3032-3036.

Owa et al., "Advantage and feasibility of immersion lithography", Nikon Corporation, (date unknown).

U.S. Appl. No. 10/705,783, filed Nov. 12, 2003, Lof et al.

U.S. Appl. No. 10/743,271, filed Dec. 23, 2003, Van Santen et al.

U.S. Appl. No. 10/743,266, filed Dec. 23, 2003, Mulkens et al.

U.S. Appl. No. 10/724,402, filed Dec. 1, 2003, Simon et al.

U.S. Appl. No. 10/705,804, filed Nov. 12, 2003, Desmit et al.

U.S. Appl. No. 10/705,785, filed Nov. 12, 2003, Derksen et al.

U.S. Appl. No. 10/715,116, filed Nov. 18, 2003, Bleeker.

U.S. Appl. No. 10/719,683, filed Nov. 24, 2003, Streefkerk et al.

U.S. Appl. No. 10/705,816, filed Nov. 12, 2003, Lof et al.

U.S. Appl. No. 10/705,805, filed Nov. 12, 2003, Lof et al.

LITHOGRAPHIC APPARATUS AND DEVICE MANUFACTURING METHOD

CROSS REFERENCE TO RELATED APPLICATIONS

This application is a continuation of U.S. application Ser. No. 10/698,012, filed Oct. 31, 2003, now U.S. Pat. No. 6,954,256, the entire contents of which are incorporated herein by reference.

BACKGROUND OF THE INVENTION

1. Field of the Invention

The present invention relates to a lithographic apparatus, in particular to a lithographic apparatus in which the space between an optical element of a projection system and a substrate is filled with at least two fluids having different indices of refraction. The present invention also relates to a device manufacturing method.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device. An example of such a patterning device is a mask. The concept of a mask is well known in lithography, and it includes mask types such as binary, alternating phase shift, and attenuated phase shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from United States Patents U.S. Pat. Nos. 5,296,891 and 5,523,193, and PCT publications WO 98/38597 and WO 98/33096. In the case of a programmable mirror array, the support may be embodied as a frame or table, for example, which may be fixed or movable as required.

Another example of a patterning device is a programmable LCD array. An example of such a construction is given in U.S. Pat. No. 5,229,872. As above, the support in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step and scan apparatus, each target portion is irradiated by progressively scanning the mask pattern under the beam of radiation in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement and/or inspection of the imaged features. This array of procedures is used as a basis to pattern an individual layer of a device, e.g. an IC. Such a patterned layer may then undergo various processes such as etching, ion-implantation (doping), metallization, oxidation, chemical, mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the beam of radiation, and such components may also be referred to below, collectively or singularly, as a "lens." Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. Nos. 5,969,441 and 6,262,796.

In order to increase the degree of integration of semiconductor devices and keep pace with Moore's law, it will be necessary to provide lithographic projection apparatus capable of printing practical minimum line widths of 25–100 nm. Currently available photolithographic tools using 193 nm and 157 nm radiation can produce pattern features having a resolution (in nm) according to the well known equation $R = k_1 \cdot \lambda / NA$, where R is the resolution, $k_1$ is a constant that is dependent on the radiation sensitive material (resist) used, $\lambda$ is the wavelength of the radiation, and NA is the numerical aperture. The numerical aperture NA is determined according to the equation $NA = n \cdot \sin \theta$, where n is the index of refraction of the material through which the radiation passes and $\theta$ is the angle of incidence of the radiation. A lower limit of $k_1$ is 0.25 and lithographic projection apparatus having a NA of 0.85 are currently available. Difficulties in optical design make increasing the NA difficult. As $k_1$ and NA are generally considered to be at their limits, the ability to decrease the resolution, i.e, print smaller pattern features, of lithographic projection apparatus appears to be dependent on decreasing the wavelength $\lambda$ of the radiation.

One method of decreasing the wavelength of the radiation is to immerse the substrate in a lithographic projection apparatus in a fluid having a relatively high refractive index, e.g., water, so as to fill the space between the optical element of the projection system (lens) and the substrate. Filling the space between the optical element of the projection system and the substrate enables the imaging of smaller features as the exposure radiation has a shorter wavelength in the fluid. The effect of the fluid may be regarded as increasing the effective NA of the system. This method can also be used to increase the depth of focus for imaging at the same resolution. The depth of focus is defined by the equation $DOF = +/- k_2 \lambda / NA^2$, where $k_2$ is a process dependent constant, $\lambda$ is wavelength, and NA is numerical aperture. Depth of focus is one of the factors determining the resolution of the lithographic apparatus and is defined as the distance along the optical axis over which the image of the pattern is adequately sharp.

One difficulty presented by filling the space between the optical element of the projection system and the substrate with a fluid is the fluid has an index of refraction between the indices of refraction of the optical element and the substrate. The index of refraction of the fluid may not be sufficient to improve the resolution of the image. The fluid is only able to provide a single decrease in the wavelength of the radiation as the index of refraction of the fluid is constant throughout the space between the optical element and the substrate.

Another problem associated with immersion lithography is that many fluids are insufficiently transparent to 193 nm and 157 nm radiation which would tend to decrease the amount of radiation incident on the substrate.

SUMMARY OF THE INVENTION

It is an aspect of the present invention to provide a lithographic apparatus in which the space between the optical element of the projection system is filled with at least two fluids having different indices of refraction in order to increase the angle of incidence of the radiation on the substrate, thus reducing reflection of the radiation by the wafer and increasing the resolution of the apparatus. As used herein, the term fluid refers to liquids, gases, and/or gels.

This and other aspects are achieved according to the invention in an immersion system for a lithographic apparatus including a radiation system configured to supply a beam of radiation; a support configured to support a patterning device, the patterning device configured to pattern the beam of radiation according to a desired pattern; a substrate table to hold a substrate; and a projection system configured to project the patterned beam onto a target portion of the substrate. The immersion system includes a transparent plate positioned between an optical element of the projection system and the substrate; a first fluid supply configured to supply a first fluid having a first index of refraction to a first space between the substrate and the transparent plate; and a second fluid supply configured to supply a second fluid having a second index of refraction filling a second space between the transparent plate and the optical element.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid crystal display panels, thin film magnetic heads, etc. n will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Figure 1:
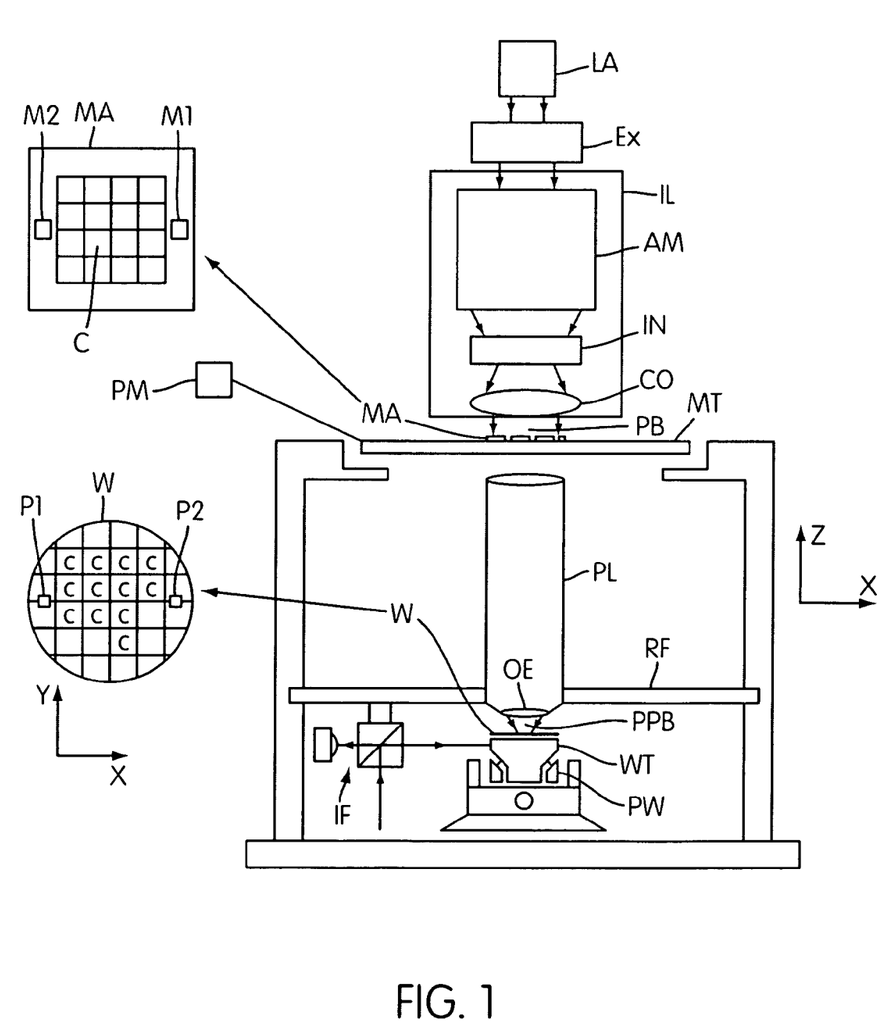
FIG. 1 is a schematic illustration of a lithographic projection apparatus according to an examplary embodiment of the invention.

FIG. 1 schematically depicts a lithographic projection apparatus 1 according to an embodiment of the invention. The apparatus includes a radiation system Ex, IL configured to supply a beam PB of radiation (e.g. UV or EUV radiation, such as, for example, generated by an excimer laser operating at a wavelength of 248 nm, 193 nm or 157 nm, or by a laser-fired plasma source operating at 13.6 nm). In this embodiment, the radiation system also comprises a radiation source LA. The apparatus also includes a first object (mask) table MT provided with a mask holder configured to hold a mask MA (e.g. a reticle), and connected to a first positioning device PM to accurately position the mask with respect to a projection system or lens PL; a second object (substrate) table WT provided with a substrate holder configured to hold a substrate W (e.g. a resist-coated silicon wafer), and connected to a second positioning device PW to accurately position the substrate with respect to the projection system or lens PL. The projection system or lens PL (e.g. a quartz and/or $CaF_2$ lens system or a refractive or catadioptric system, a mirror group or an array of field deflectors) is configured to image an irradiated portion of the mask MA onto a target portion C (e.g. comprising one or more dies) of the substrate W. The projection system PL is supported on a reference frame RF. The apparatus may employ another kind of patterning device, such as a programmable mirror array of a type as referred to above.

The source LA (e.g. a UV excimer laser, an undulator or wiggler provided around the path of an electron beam in a storage ring or synchrotron, a laser-produced plasma source, a discharge source or an electron or ion beam source) produces radiation. The radiation is fed into an illumination system (illuminator) IL, either directly or after having traversed a conditioner, such as a beam expander Ex, for example. The illuminator IL may comprise an adjusting device AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). The latter scenario is often the case when the source LA is an excimer laser. The present invention encompasses both of these scenarios. In particular, the present invention encompasses embodiments wherein the radiation system Ex, IL is adapted to supply a beam of radiation having a wavelength of less than about 170 nm, such as with wavelengths of 157 nm, 126 nm and 13.6 nm, for example.

The beam PB subsequently intercepts the mask MA, which is held on the mask table MT. Having traversed the mask MA, the beam PB passes through the lens PL, which focuses the beam PB onto a target portion C of the substrate W. With the aid of the second positioning device PW and interferometer IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning). However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;

2. In scan mode, essentially the same scenario applies, except that a given target portion C is not exposed in a single "flash." Instead, the mask table MT is movable in a given direction (the so-called "scan direction", e.g. the Y direction) with a speed v, so that the beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
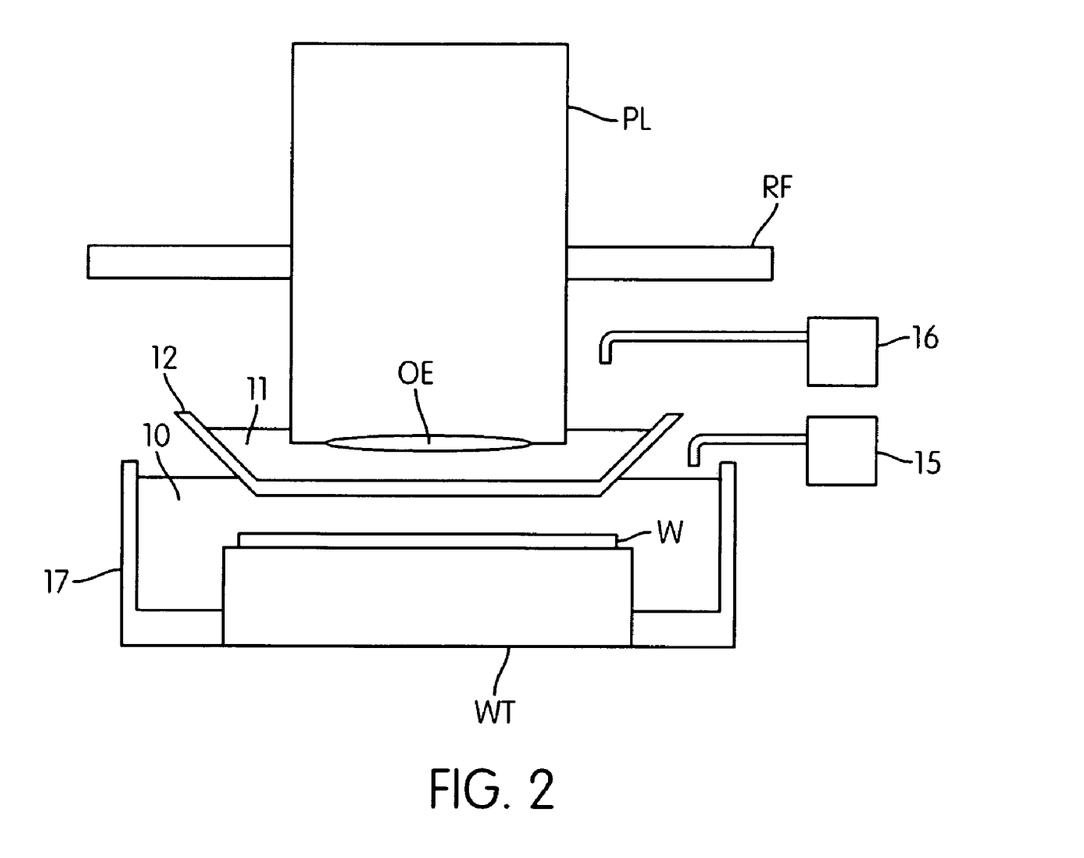
FIG. 2 is a schematic illustration of immersion of the substrate table, the substrate and the optical element of the projection system of the apparatus of FIG. 1.

Referring to FIG. 2, the substrate table WT is immersed in a first fluid 10 having a first index of refraction. The first fluid 10 is provided by a first fluid supply system 15. A transparent plate, or dish, 12 is positioned between the projection system PL and the substrate table WT. The space between an optical element OE (e.g., a lens) of the projection system PL and the transparent plate 12 is filled with a second fluid 11 having a second index of refraction. The second index of refraction is different from the first index of refraction. The second fluid 11 is provided by a second fluid supply system 16. The transparent plate 12 has a third index of refraction that is preferably between the first index of refraction of the first fluid 10 and the second index of refraction of the second fluid 11.

Figure 3:
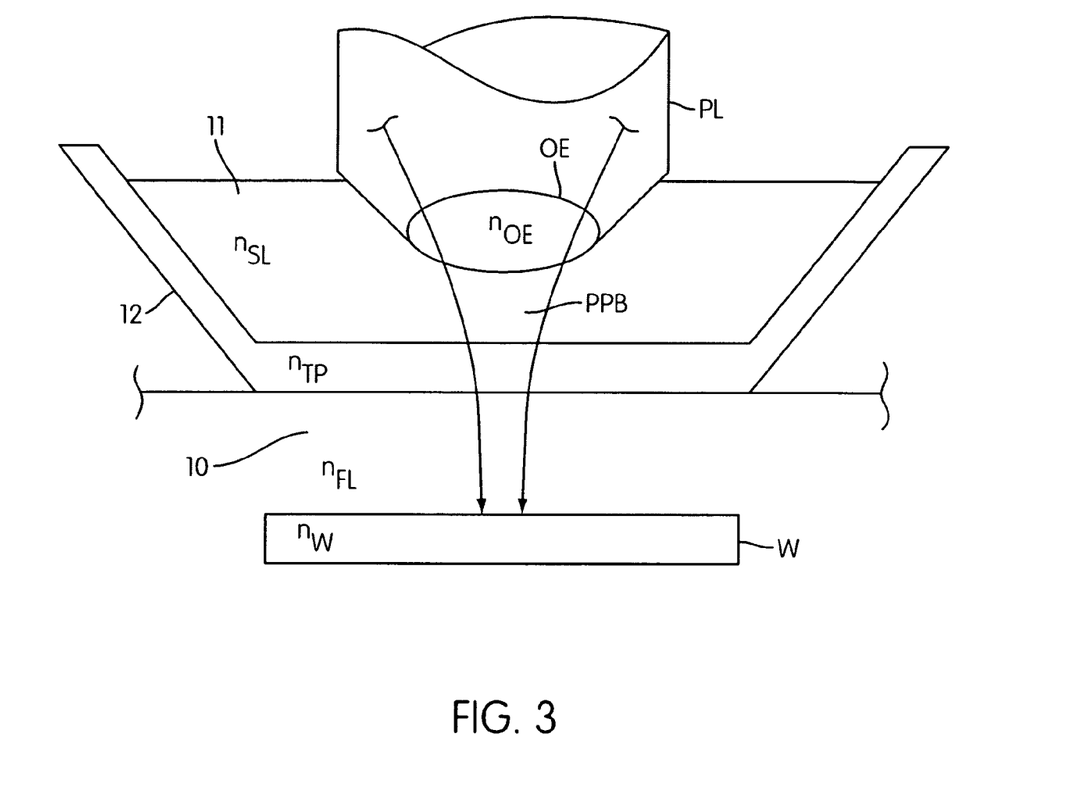
FIG. 3 is a schematic illustration of the passage of a patterned beam of radiation from an optical element through a second fluid, a transparent plate, and first fluid incident on a substrate.

Referring to FIG. 3, an optical element OE of the projection system PL has a index of refraction $n_{OE}$ and the substrate W has an index of refraction $n_W$ that is larger than the index of refraction $n_{OE}$ of the optical element OE. The optical element, for example a lens, may be formed, for example, of glass, fused silica, quartz, or CaF2, and have, for example a index of refraction $n_{OE}$ of about 1.4 to about 1.6. The optical element OE may be formed of, for example, fused silica, commonly used in deep ultraviolet (DUV) lithography, and have an index of refraction $n_{OE}$ of about 1.46. As another example, the optical element OE may be formed of CaF2, commonly used in 157 nm lithography, and have an index of refraction $n_{OE}$ ranging from about 1.4 to about 1.56.

The second fluid 11 may be, for example, water and have an index of refraction $n_{SL}$ of about 1.3 to 1.35 for use with radiation having a wavelength of 248 nm. In the case of using water as the second fluid 11 with radiation having a wavelength of, for example 193 nm, the index of refraction $n_{SL}$ should be approximately 1.44. The index of refraction $n_W$ of the substrate W may be, for example, between 1.7 to 1.8.

The first fluid 10 has an index of refraction $n_{FL}$ that may be relatively higher than the index of refraction $n_{SL}$ of the second fluid 11. The first fluid 10 may be a perfluoropolyether (PFPE) fluid. The PFPE fluid may be, for example, FOMBLIN® or GALDEN®, available from Ausimont Corporation, or KRYTOX®, available from DuPont. PFPE fluids are currently used as lubricants in vacuum pumps and thus are compatible with clean room environments in which photolithographic projection apparatus are used. PFPE fluids are optically clean, non-toxic, chemically inert, and compatible with at least some current resist materials. PFPE fluids have a 157 nm absorbance $\alpha = 10^{-3}$ µm$^{-1}$ base 10, which is a thousands times lower than current experimental 157 nm resists. FOMBLIN® Z-25 has an index of refraction at 157 nm of n=1.35. FOMBLIN® Y-18 has an index of refraction at 157 nm of n=1.37. FOMBLIN® Y-140, a higher molecular weight version, has an index of refraction at 157 nm of n=1.38.

PFPE fluids also have an index of refraction that is closely matched to CaF$_2$, commonly used to form optical elements of the projection system in 193 nm lithography for color correction and commonly used for optical elements in 157 nm lithography. PFPE fluids are chemical and solvent resistant. They also have excellent thermal and electrical resistance and are non-reactive with metal, plastic, elastomers and rubber. PFPE fluids are inert to liquid and gaseous oxygen and are nonflammable. Because PFPE fluids are inert to liquid and gaseous oxygen they are not affected by the high oxygen conditions found in photo-resist stripping processes. PFPE fluids can also withstand Lewis acids produced during aluminum etching, products from sulfur, most acids, most bases and most oxidizing agents. They are available in a variety of viscosities and have low evaporation loss. PFPE fluids also have excellent radiation hardness and resistance to polymerization in the presence of ionizing radiation. PFPE fluids have zero ozone depletion potential and are not classified as volatile organic chemicals by the Environmental Protection Agency.

The transparent plate 12 has an index of refraction $n_{TP}$ that is between the index of refraction $n_{FL}$ of the first fluid 10 and the index of refraction $n_{SL}$ of the second fluid 11. The transparent plate 12 may be formed of any material that is transparent to the particular wavelength radiation, e.g., 365 nm, 248 nm, 193 nm, 157, or 126 nm, generated by the radiation system Ex, IL of the lithographic projection apparatus 1 and has an index of refraction $n_{TP}$ between the indices of refraction of the first fluid 10 and the second fluid 11, including an index of refraction $n_{TP}$ being equal to either the index of refraction $n_{FL}$ or $n_{SL}$ of the first fluid 10 or the second fluid 11, respectively. It should also be appreciated that the entire plate 12 need not be transparent, only those portions through which the patterned beam passes through.

As shown in FIG. 3, the patterned beam PPB exits the optical element OE of the projection system PL and enters the second fluid 11. As the patterned beam PPB passes the boundary between the optical element OE and the second fluid 11 and passes into the second fluid 11, it is deflected as its velocity changes upon entering the second fluid 111. It should be appreciated that if the index of refraction $n_{SL}$ of the second fluid 11 is equal to the index of refraction $n_{OE}$ of the optical element OE, the patterned beam PPB will not be deflected.

The transparent plate 12 may have an index of refraction $n_{TP}$ that is equal to or higher than the index of refraction $n_{SL}$ of the second fluid 11. As the patterned beam PPB passes from the second fluid 11 into the transparent plate 12 it is deflected. It should be appreciated that the index of refraction $n_{TP}$ of the transparent plate 12 may be equal to the index of refraction $n_{SL}$ of the second fluid 11 in which case the patterned beam PPB will not be deflected upon entering the transparent plate 12.

The first fluid 10 has an index of refraction $n_{FL}$ that may be equal to or higher than the index of refraction $n_{TP}$ of the transparent plate 12. If the index of refraction $n_{TP}$ of the transparent plate 12 is equal to the index of refraction $n_{SL}$ of the second fluid 11, the index of refraction $n_{FL}$ of the first fluid 10 must be higher than the index of refraction $n_{TP}$ of the transparent plate 12 to provide a variable index of refraction. If the index of refraction $n_{FL}$ of the first fluid 10 is higher than the index of refraction $n_{TP}$ of the transparent plate 12, the patterned beam PPB is deflected as it leaves the transparent plate 12 and enters the first fluid 10. The patterned beam PPB passes through the first fluid 10 and is then incident on the substrate W.

Although the first fluid 10 has been described as a PFPE fluid and the second fluid 11 has been described as water, it will be appreciated that the first and second fluids 10 and 11 may both be PFPE fluids, or any other fluid of suitable transparency to the wavelength of radiation provided by the radiation system of the apparatus, as long as the index of refraction $n_{FL}$ of the first fluid 10 is different than the index of refraction $n_{SL}$ of the second fluid 11. It should also be appreciated that the first and second fluids 10 and 111 are selected based on their indices of refraction relative to the indices of refraction of the substrate W and the optical element OE of the projection system PL, respectively. The first fluid 10 should have an index of refraction similar to the index of refraction of the substrate and the second fluid should have an index of refraction similar to the index of refraction of the optical element as possible.

The index of refraction from the optical element, to the second fluid, to the transparent plate, to the second fluid, and to the wafer is thus continuously varied. Any combination of indices of refraction of the optical element, the second fluid, the transparent plate, the first fluid and the substrate that produces a variable index of refraction between the optical element and substrate so as to increase the angle of incidence of the patterned beam on the substrate is contemplated by the invention. The effect of this continuously varying index of refraction is an increase in the angle of incidence of the patterned beam on the substrate, a decrease of reflection of the patterned beam by the substrate, and an increase in the resolution of the apparatus.

It should be appreciated that more than two fluids may be provided between the optical element and the substrate. The space may be filled with three or more fluids. It should also be appreciated that the three or more fluids may be separated by two or more transparent plates, respectively. It should also be appreciated that the depth of the first and second fluids may be varied (e.g. by the fluid supplies 15 and/or 16) to further vary the index of refraction from the optical element to the substrate. It should further be appreciated that the depth (thickness) of the transparent plate may be varied to further vary the index of refraction from the optical element to the substrate.

Figure 4:
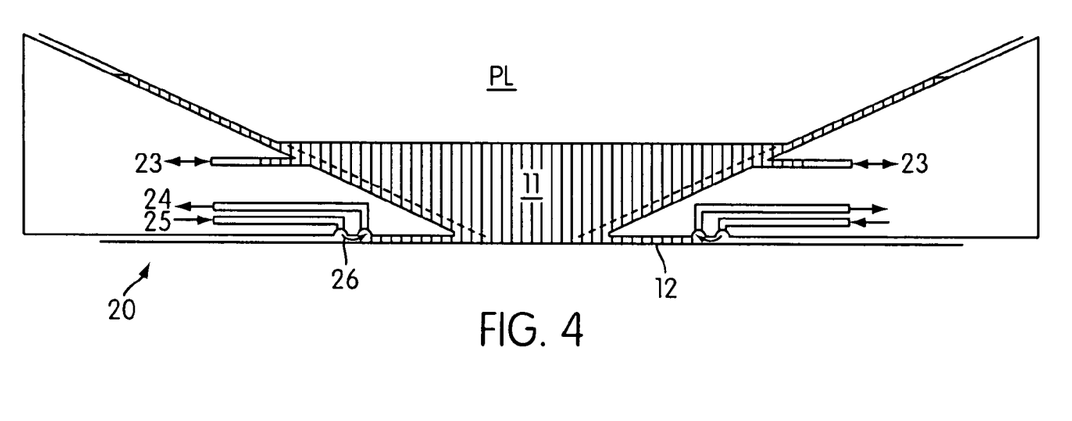
FIG. 4 is a schematic illustration of a system for providing fluid between the projection system and the transparent plate.

FIG. 4 shows the second fluid 11 between the projection system PL and the transparent plate 12. A fluid reservoir 20 is filled with the second fluid 111 provided via inlet/outlet ports 23.

The reservoir 20 forms a contactless seal to the transparent plate 12 around the image field of the projection system PL so that fluid is confined to fill the space between the transparent plate 12 and the optical element of the projection system PL. The reservoir 20 is formed by a seal member 21 positioned below and surrounding the optical element of the projection system PL. The second fluid 11 is brought into the space below the projection system PL and within the seal member 21. The seal member 21 extends a little above the optical element of the projection system PL and the fluid level rises above the optical element so that a buffer of fluid is provided. The seal member 21 has an inner periphery that at the upper end closely conforms to the optical element and may be round, for example. At the bottom, the inner periphery closely conforms to the shape of the image field and may be rectangular, for example.

The first fluid 11 is confined to the reservoir by a gas seal 26 between the bottom of the seal member 21 and the surface of the transparent plate 12. The gas seal 26 is formed by gas, e.g. air or synthetic air, provided under pressure via inlet 25 to the gap between the seal member 12 and extracted via outlet 24. The overpressure on the gas inlet 25, vacuum level on the outlet 24 and geometry of the gap are arranged so that there is a high-velocity air flow inwards that confines the fluid. This shown in more detail in FIG. 5.

Figure 5:
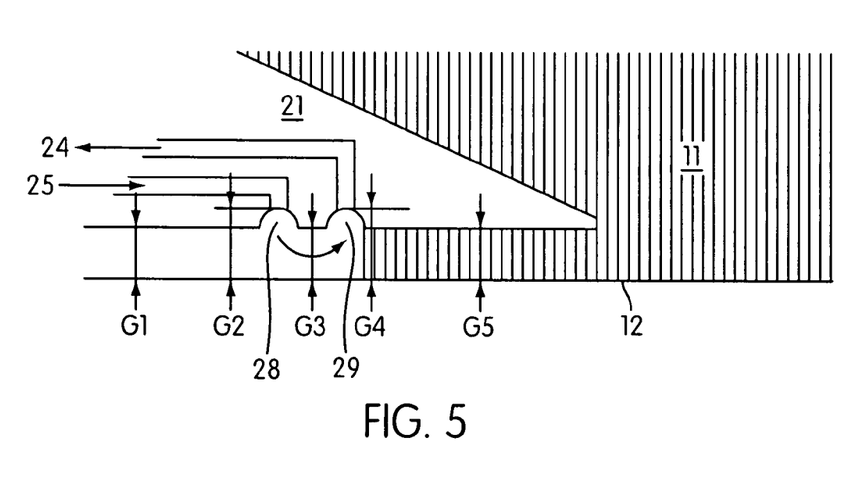
FIG. 5 is an enlarged view of the system of FIG. 4.

The gas seal 26 is formed by two annular grooves 28, 29 which are connected to the inlet 25 and outlet 24, respectively, by a series of small conducts spaced around the grooves. A large annular hollow in the seal member 21 may be provided in each of the inlet 25 and outlet 24 to form a manifold.

A gap G1, on the outer side of the gas inlet 25, is small and long so as to provide resistance to air flow outwards. A gap G2, at the radius of the inlet 25, is a little larger to ensure a sufficient distribution of gas around the seal member 21. The inlet 25 is formed by a number of small holes around the seal member 21. A gap G3 is chosen to control the gas flow through the seal. A gap G4 is larger, to provide a good distribution of vacuum. The outlet 24 is formed of a number of small holes in the same manner as the inlet 15. A gap G5 is small, to prevent gas bubbles entering the space, and in this embodiment to ensure that capillary action will always fill it with fluid.

The gas seal 26 is thus a balance between the capillary forces pulling fluid into the gap and the airflow pushing liquid out. As the gap widens from G5 to G4, the capillary forces decrease and the airflow increases so that the fluid boundary will lie in this region and be stable under the projection system PL.

The pressure difference between the inlet at the gap G2 and the outlet at the gap G4 as well as the size and geometry of the gap G3, determine the gas flow through the seal 26 and will be determined according to the specific embodiment. However, a possible advantage is achieved if the length of the gap G3 is short and the absolute pressure at the gap G2 is twice that at the gap G4, in which case the gas velocity will be the speed of sound in the gas and cannot rise any higher. A stable gas flow will therefore be achieved.

The gas outlet system can also be used to completely remove the fluid from the system by reducing the gas inlet pressure and allowing the fluid to enter the gap G4 and be sucked out by the vacuum system, which can easily be arranged to handle the fluid as well as the gas used to form the seal. Control of the pressure in the gas seal 26 can also be used to ensure a flow of fluid through the gap G5 so that fluid in this gap does not disturb the temperature of the fluid in the main space below the projection system.

The shape of the seal member 21 around the gas inlet 25 and outlet 24 should be chosen to provide laminar flow as far as possible so as to reduce turbulence and vibration. Also, the gas flow should be arranged so that the change in flow direction at the fluid interface is as large as possible to provide maximum force confining the fluid.

It should be appreciated that a similar system as shown in FIGS. 4 and 5 is between the substrate W and the transparent plate 12. The system shown in FIGS. 4 and 5 is more fully described in U.S. patent application Ser. No. 10/705,805 filed Nov. 12, 2003, the entire contents of which are incorporated herein by reference.

Figure 6:
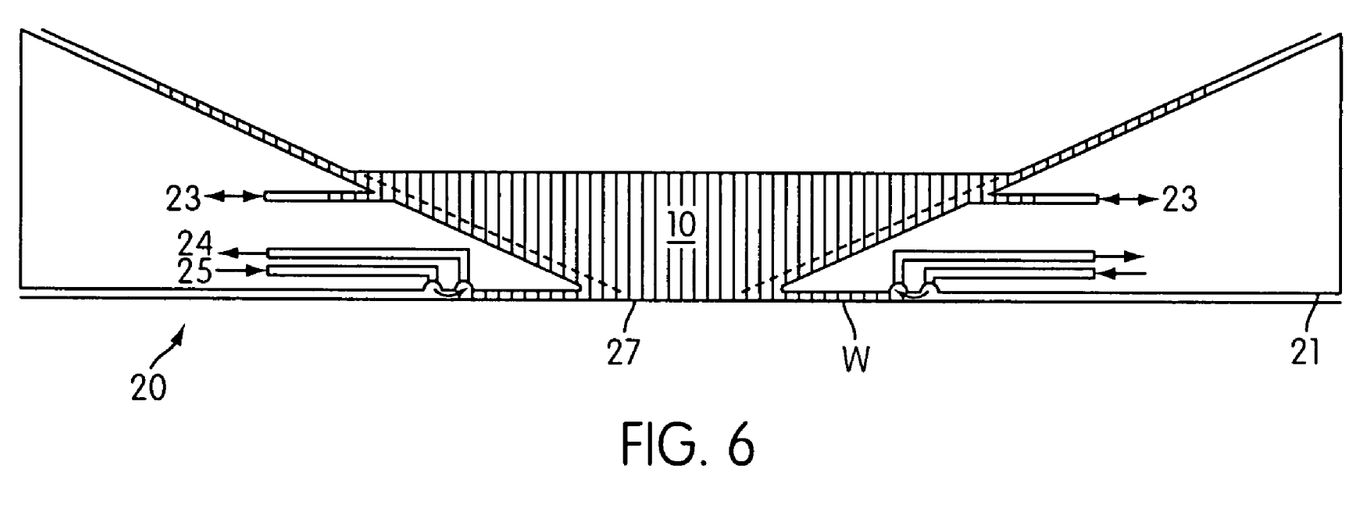
FIG. 6 is a schematic illustration of a system for providing fluid between the transparent plate and the substrate.

FIG. 6 shows a cover plate 27 provided on the substrate table WT. The cover plate 27 has an upper surface coplanar with the substrate W and is closely adjacent to the edge of the substrate W so that there is no sudden loss of fluid as the edge of the substrate W moves under the projection system PL. A vacuum outlet is preferably provided under the gap between the substrate W and cover plate 27 to remove any fluid passing into the gap and any gas from the gas seal to prevent it from entering the space.

A device manufacturing method includes providing the substrate W at least partially covered by a layer of radiation-sensitive material. The patterned beam PPB is projected onto a target portion of the layer of radiation-sensitive material using the projection system. The space between an optical element of the projection system and the substrate is filled with at least two fluids. The two fluids have different indices of refraction. The transparent plate separates the two fluids.

It will be appreciated that the device manufacturing method of the present invention may be preceded by design of the functions and performance of the device and a pattern to realize the functions. It will also be appreciated that the design and manufacture of a mask according to the present invention may also precede the method. It will also be appreciated that substrate, or wafer, production and processing may precede the method. The wafer processing may include, for example, oxidizing the wafer surface, forming an insulation film on the wafer surface, forming an electrode, such as by vacuum deposition, on the wafer, implanting ions into the wafer, and doping the wafer with a photosensitive agent. Other wafer processing steps that may follow the method include developing the resist, removing the developed resist, such as by etching, and removing unnecessary resist after etching. It will also be appreciated that device assembly and inspection, including, for example, dicing, bonding, packaging (chip sealing), and operation and durability check testing, may follow the method.

While specific embodiments of the invention have been described above, it will be appreciated that the invention may be practiced otherwise than as described. The description is not intended to limit the invention.

What is claimed is:

1. An immersion system for a lithographic projection apparatus, the lithographic projection apparatus including a radiation system configured to provide a beam of radiation; a support configured to supporting a patterning device, the patterning device configured to pattern the beam according to a desired pattern; a substrate table configured to hold a substrate; and a projection system configured to project the patterned beam onto a target portion of the substrate, the immersion system comprising:
   a transparent plate positioned between an optical element of the projection system and the substrate;
   a first fluid supply configured to supply a first fluid having a first index of refraction to a first space between the substrate and the transparent plate; and
   a second fluid supply configured to supply a second fluid having a second index of refraction to a second space between the transparent plate and the optical element, wherein the first fluid supply is a first reservoir filled with the first fluid and the second fluid supply is a second reservoir filled with the second fluid and the second fluid is confined to the second reservoir by a gas seal, the gas seal including an inlet configured to introduce a gas to the second space and an outlet configured to extract gas from the second space.

2. An immersion system according to claim 1, wherein the first index of refraction is greater than the second index of refraction.

3. An immersion system according to claim 1, wherein the second index of refraction is greater than the first index of refraction.

4. An immersion system according to claim 1, wherein the transparent plate has a third index of refraction.

5. An immersion system according to claim 4, wherein the third index of refraction is between the first index of refraction and the second index of refraction.

6. An immersion system according to claim 4, wherein the third index of refraction is substantially equal to the first index of refraction.

7. An immersion system according to claim 4, wherein the third index of refraction is substantially equal to the second index of refraction.

8. An immersion system according to claim 1, wherein the first index of refraction is substantially equal to an index of refraction of the substrate.

9. An immersion system according to claim 1, wherein the second index of refraction is substantially equal to an index of refraction of the optical element.

10. An immersion system according to claim 1, wherein the first fluid is one of a perfluoropolyether fluid and water and the second fluid is one of a perfluoropolyether fluid and water.

11. An immersion system according to claim 1, wherein the first and second fluids are perfluoropolyether fluids.

12. An immersion system according to claim 1, wherein the second reservoir is a seal member positioned below and surrounding the optical element.

13. An immersion system according to claim 1, wherein the second reservoir includes a fluid inlet and a fluid outlet.

14. An immersion system according to claim 1, wherein the gas flow from the inlet to the outlet is laminar.

15. An immersion system according to claim 1, further comprising a cover plate configured to be coplanar with the substrate and closely adjacent to the substrate.

16. An immersion system according to claim 15, wherein the cover plate is provided on the substrate table.

17. An immersion system according to claim 15, further comprising a vacuum outlet configured to remove any first fluid in a gap between the cover plate and the substrate.

* * * * *